(12) United States Patent
Zaspalis et al.

(10) Patent No.: US 7,158,365 B2
(45) Date of Patent: Jan. 2, 2007

(54) METHOD OF PRODUCING A MULTILAYER MICROELECTRONIC SUBSTRATE

(75) Inventors: Vassilios Zaspalis, Thessaloniki (DE); Jacobus Gerardus Boerekamp, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 42 days.

(21) Appl. No.: 10/494,750

(22) PCT Filed: Nov. 13, 2002

(86) PCT No.: PCT/IB02/04763

§ 371 (c)(1), (2), (4) Date: May 7, 2004

(87) PCT Pub. No.: WO03/043035

PCT Pub. Date: May 22, 2003

(65) Prior Publication Data

US 2005/0011602 A1    Jan. 20, 2005

(30) Foreign Application Priority Data

Nov. 13, 2001 (DE) ............... 101 55 594

(51) Int. Cl.
*H01G 4/22* (2006.01)

(52) U.S. Cl. ............. 361/314; 361/311; 361/313; 361/321.2; 361/321.4; 361/306.1

(58) Field of Classification Search ........ 361/311–314, 361/321.1–321, 306.1–306, 321.4, 321.5, 361/303–305; 252/62.54, 62.56
See application file for complete search history.

(56) References Cited

U.S. PATENT DOCUMENTS 3,020,426 A * 2/1962 van der Burgt ............ 310/26

(Continued)

FOREIGN PATENT DOCUMENTS

| DE | 19924354 | 11/2000 |
|----|----------|---------|
| JP | 541315 | 2/1993 |
| JP | 6237742 | 9/1994 |

(Continued)

*Primary Examiner*—Nguyen T. Ha

(57) ABSTRACT

A method of producing a multilayer microelectronic substrate, in which:
- a) a number of thermally combinable films with a first compression temperature are provided;
- b) at least one film with a second compression temperature, which lies above the first compression temperature, is provided;
- c) at least one of the films with the second compression temperature is arranged between films with the first compression temperature;
- d) the laminated films are heated to the first compression temperature, and further to a first end-temperature until the films with the first compression temperature are completely compressed, the first end-temperature being kept below the second compression temperature; and
- e) the laminated films are heated to the second compression temperature and, if applicable, further to a second end-temperature in order to compress the at least one film with the second compression temperature, characterized in that at least one of the films is made from magnetodielectric material, with nickel oxide NiO and ferrous oxide Fe2O3 as the main components of a ferrite which contains bismuth oxide Bi2O3 or a eutectic mixture of lead oxide PbO and at least one further metallic oxide or of bismuth oxide Bi2O3 and at least one further metallic oxide.

8 Claims, 1 Drawing Sheet

U.S. PATENT DOCUMENTS

| | | | |
|---|---|---|---|
| 5,176,771 A * | 1/1993 | Bravo et al. ................... 156/85 |
| 5,517,751 A * | 5/1996 | Bross et al. ................... 29/830 |
| 5,519,566 A * | 5/1996 | Perino et al. ............ 361/321.4 |
| 5,600,533 A * | 2/1997 | Sano et al. ............... 361/321.4 |
| 5,648,015 A * | 7/1997 | Reczek ........................ 216/22 |
| 5,870,273 A * | 2/1999 | Sogabe et al. ............ 361/306.3 |
| 6,492,733 B1 * | 12/2002 | Nakamura et al. .......... 257/758 |

FOREIGN PATENT DOCUMENTS

| | | |
|---|---|---|
| JP | 9306716 | 11/1997 |
| SU | 378969 | 4/1973 |
| SU | 661620 | 5/1979 |
| TW | 398060 A | 11/1998 |
| WO | WO0004577 | 1/2000 |

* cited by examiner

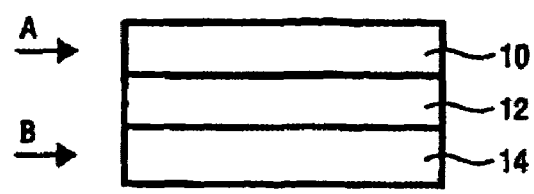
FIG.1a
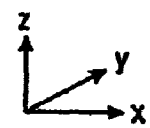
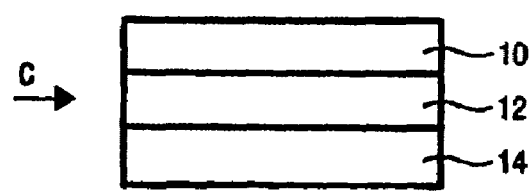
FIG.1b
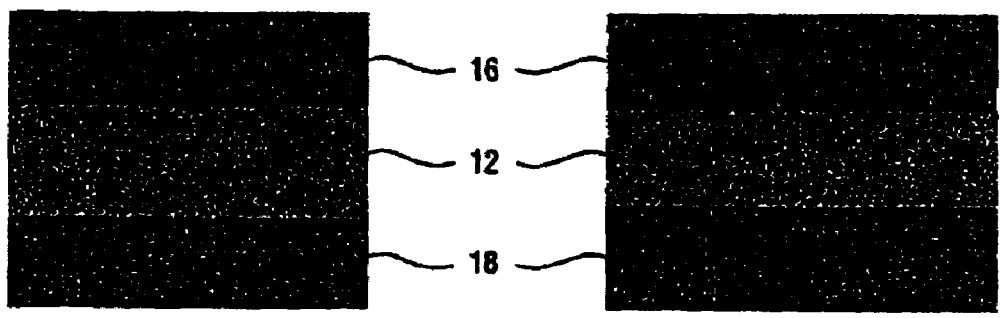
FIG.2a     FIG.2b
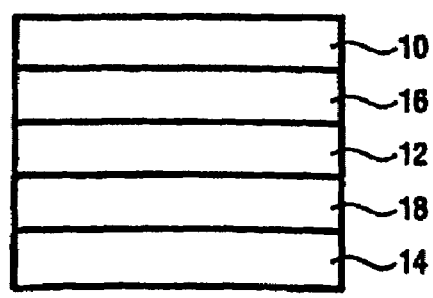
FIG.3

METHOD OF PRODUCING A MULTILAYER MICROELECTRONIC SUBSTRATE

BACKGROUND AND SUMMARY OF THE INVENTION

The invention relates to a method of producing a multilayer microelectronic substrate.

Magnetodielectric materials, for example with nickel oxide NiO and ferrous oxide $Fe_2O_3$ as the main components of a ferrite, form an important basic material for components used in electronics and telecommunications. They are used in components which are described as inductors and transformers in the widest sense. They are produced in that a pre-sintered mixture of powdery raw materials is pressed into the desired shape, after which conversion into a ceramic component takes place by firing.

Ferrites also have favorable properties in the high-frequency or microwave ranges, making them well suited for the construction of components of this kind. The electromagnetic radiation can penetrate into the ferrites to a considerable extent, and is thereby modified in a predetermined manner through interaction between the magnetic and electrical field components of the wave and the dielectric and magnetic properties of the material. High-frequency filters. e.g. gyrators, insulators or components for the absorption of electromagnetic interference, can be constructed thereby, these being used in telecommunications devices, for example in power amplifiers for high-frequency modules.

An important technology for the production of microelectronic substrates with a high allocation density is the so-called Low Temperature Cofire Ceramics technology, hereinafter referred to as LTCC technology. Insulating ceramic films, which normally also contain openings for the vertical connections, are hereby printed with metallic conductor patterns, whereupon the laminated films are fired at temperatures between 850° C and 900° C.

Ferrite materials hitherto available have sintering temperatures that are significantly above 1200° C. These high sintering temperatures prevent ferrite materials from being used in LTCC modules, since they cannot be sintered jointly with the ceramic films used in this case.

A further problem of LTCC technology is the occurrence of shrinkage during sintering as a result of the reduced porosity of the ceramic material. The shrinkage hereby is approximately 15 to 18% in all directions. Of even greater importance is the fact that, in mass production, a further 15% relative tolerance exists in respect of the shrinkage obtained. This means, for example, that the location of an external contact point on the surface of the fired substrate can be predicted only with a probability area having a radius which increases as a measure of the shrinkage or shrinkage tolerance. This makes the automatic arrangement of chips or other discrete components of the circuit on the surface of the LTCC substrate very difficult. Large areas for the external contact points in order to circumvent this problem preclude further miniaturization. In addition, the affixing of discrete components of the latest generation 0201 standard is also problematic, if not completely impossible.

Solutions are known in the prior art that are intended to counteract the problem of shrinkage. To this end, as described in, for example, TW-A-398060, a further flexible layer, which is intended to prevent uneven shrinkage and which consists of, for example, a ceramic sinterable at high temperature, is applied to the actual LTCC laminate. This layer is removed again on conclusion of the sintering process. Shrinkages are thereby achieved which lie between only 0 and 1%, and are thereby considerably below the values specified above. The shrinkage tolerances are also said to be reduced hereby. Shrinkage will then occur only in the z-direction perpendicular to the x-y plane of the laminated films.

The use of a multi-stage sintering process for producing a ceramic body is known from WO 00/04577. At least two materials, which differ from one another at least in respect of the temperature interval necessary for compression, are used hereby. There is no temperature range in which the first ceramic material and the second ceramic material compress simultaneously. The shrinkage of the first ceramic material is already concluded before the shrinkage of the second ceramic material begins. With a method of this kind, a microelectronic substrate in which a dielectric material with a composition of the generic type specified above is embedded between two lower compression films, can be produced with improved shrinkage behavior, whereby the construction of passive components in the LTCC structure is possible.

The modification of ferrites by means of auxiliary agents in order to improve their electrical and magnetic properties is known.

For example, DE 199 24 354 A1 describes a magnetodielectric material which contains as its main components manganous oxide, zinc oxide and ferrous oxide, to which a eutectic mixture of lead (II) oxide and tungsten (IV) oxide is added in a quantity between 0 and 1500 ppm. It is mentioned that this eutectic mixture maintains the sintering temperatures at a lower level, so that smaller grain sizes are achieved, which in turn give rise to lower magnetic losses. The sintering temperatures referred to in DE 199 24 354 A1 are all above 1200° C.

SU 661 620 A describes a nickel-ferrite material which, in addition to stannic oxide and cobalt oxide, also contains tungsten oxide in a proportion of 0.01 to 1 mol %. In order to improve the initial magnetic permeability and the coefficient of frequency tuning, it also contains 0.2 to 2.0% by weight lead oxide.

It is known from SU 378 969 A that the addition of zinc oxide reduces losses in high-frequency fields. JP 06 267 742 A discloses a nickel-ferrite material for a magnetic core which is to be used for switching high-frequency power. The added tungsten oxide is thereby credited with reducing the losses in the high-frequency band. Also concerned with the reduction of power losses is JP 05 041 315 A, which proposes to this end that a manganese-zinc-based ferrite mixture containing silicon dioxide should be pre-treated to form a eutectic compound.

JP 09 306 716 A1 discloses the addition to a nickel ferrite of 0.2 to 0.5% by weight lead oxide or 0.05 to 0.13% by weight $HBO_3$ or 0.2 to 0.5% by weight bismuth oxide and 0.4 to 1.0% by weight tungsten oxide, 0.25 to 0.65% by weight stannic oxide, 0.15 to 0.45% by weight aluminum oxide, 0.25 to 0.65% by weight chromium oxide and/or 0.1 to 0.25% by weight $SiO_2$.

In the case of all these compositions, no mention is made of a consistent reduction in sintering temperature.

It is an object of the invention to indicate a method of producing a multilayer microelectronic substrate, with which method passive magnetic components can also be incorporated into the substrate using LTCC technology.

This object is achieved by a method as claimed in claim 1. Advantageous embodiments are the subject matter of the dependent claims. A microelectronic substrate is defined in claim 8 and the dependent claims related to it. The preferred use is specified in claim 15.

It is provided according to the invention that a magneto-dielectric, nickel-ferrite-based material, containing bismuth oxide $Bi_2O_3$ or a eutectic mixture of lead oxide PbO and at least one further metallic oxide or of bismuth oxide $Bi_2O_3$ and at least one further metallic oxide, is used in a method as described in WO 00/04577.

Preference is given to the further metallic oxide molybdenic oxide $MoO_3$, zinc oxide ZnO, silicon dioxide $SiO_2$, boric oxide $B_2O_3$ or tungsten oxide $WO_3$.

It has transpired that the bismuth oxide or the eutectic mixture should be contained in a quantity of 1 to 10% by weight of the ferrite, preferably in a quantity of more than 2 to 10% by weight and, further preferred, in a quantity of 4 to 10% by weight. The sintering temperature drops thereby if the proportion of the eutectic mixture in the ferrite is increased, so it is particularly preferred if the bismuth oxide or the eutectic mixture is added in a quantity of 8 to 10% by weight of the ferrite. In a particularly preferred composition, the ferrite contains $Ni_vZn_wCo_yFe_zO_4$, where $0.88 \leq v \leq 1$, $0 \leq w \leq 0.8$, $0 \leq y \leq 0.03$ and $1.7 \leq z \leq 2.2$.

Using the method according to the invention, a multilayer microelectronic substrate, which also contains passive magnetic components, can be produced, where the advantage of the low sintering temperature can be exploited. Using this method, further dielectric ceramic compositions can be used, such as substituted barium-neodymium-titanium-perovskite.

BRIEF DESCRIPTION OF THE DRAWING

The invention will be further described with reference to examples of embodiment shown in the drawings, to which, however, the invention is not restricted.

FIG. 1 shows in schematic form in part-illustrations (a) and (b) the improved shrinkage behavior in a triple-layer structure of a microelectronic substrate produced using a particular method management.

FIG. 2 shows, in each of part-illustrations (a) and (b), a microstructure image of the boundary area between an NPO layer and a ferrite layer at a sintering temperature of approximately 970° C. and 1030° C. respectively.

FIG. 3 shows in schematic form a five-layer structure of a microelectronic substrate.

DETAILED DESCRIPTION OF THE INVENTION

Examples will firstly be given of nickel-ferrites that can be used in the method according to the invention.

EXAMPLE 1

A nickel ferrite with a composition of $Ni_vZn_wCo_yFe_zO_4$, where $0.88 \leq v \leq 1$, $0 \leq w \leq 0.8$, $0 \leq y \leq 0.03$ and $1.7 \leq z \leq 2.2$, was produced from the corresponding molar relations of ferrous oxide $Fe_2O_3$, nickel oxide NiO, zinc oxide ZnO, cobalt oxide CoO. Distilled water was added to the oxides, and they were mixed wet in a steel ball mill. Following filtration, drying and pre-sintering at 800° C, milling again took place.

A eutectic Pb—W—O phase corresponding to a PbO—$WO_3$ mixture with approximately 16.5 mol % PbO, was used as the additive for lowering the sintering temperature. It has a melting point of 730° C. The additive was added following the pre-sintering, while comminution was again taking place. The powder was then rendered in granulate form using a PVA binder, and finally pressed into toroidal cores with a height of 5mm, outside diameter of 14 mm and inside diameter of 9 mm, and sintered in air.

Table 1 summarizes the results for different quantities of added additive. A sintering temperature below 1200° C is always achieved.

TABLE 1

| Experiment | Composition | Added Pb—W—O-Phase (% by weight) | Sintering temperature (C.) | Density (g/cm³) | Magnetic Permeability (at 25° C.) | Resonant frequency (GHz) |
|---|---|---|---|---|---|---|
| 1 | $NiFe_{2.12}O_x$ | 4.0 | 1000 | 4.39 | 9.3 | 0.7 |
| 2 | $NiFe_{2.12}O_x$ | 4.0 | 1050 | 4.80 | 12.2 | 0.6 |
| 3 | $NiFe_{2.12}O_x$ | 4.0 | 1100 | 4.99 | 18.2 | 0.4 |
| 4 | $NiFe_{2.12}O_x$ | 4.0 | 1150 | 5.07 | 20.3 | 0.3 |
| 5 | $Ni_{0.954}Zn_{0.030}Co_{0.016}Fe_{1.82}O_4$ | 1.0 | 1100 | 5.07 | 12.9 | 0.65 |
| 6 | $Ni_{0.954}Zn_{0.030}Co_{0.016}Fe_{1.82}O_4$ | 1.0 | 1150 | 5.18 | 15.2 | 0.4 |
| 7 | $Ni_{0.954}Zn_{0.030}Co_{0.016}Fe_{1.82}O_4$ | 3.0 | 950 | 4.50 | 6.3 | 1 |
| 8 | $Ni_{0.954}Zn_{0.030}Co_{0.016}Fe_{1.82}O_4$ | 3.0 | 1000 | 4.90 | 7.3 | 0.7 |
| 9 | $Ni_{0.954}Zn_{0.030}Co_{0.016}Fe_{1.82}O_4$ | 3.0 | 1050 | 4.92 | 8.6 | 0.8 |
| 10 | $Ni_{0.954}Zn_{0.030}Co_{0.016}Fe_{1.82}O_4$ | 3.0 | 1100 | 5.15 | 11.7 | 0.7 |
| 11 | $Ni_{0.954}Zn_{0.030}Co_{0.016}Fe_{1.82}O_4$ | 3.0 | 1150 | 5.21 | 14.8 | 0.4 |
| 12 | $Ni_{0.954}Zn_{0.030}Co_{0.016}Fe_{1.82}O_4$ | 10.0 | 875 | 4.50 | 4.6 | >1 |
| 13 | $Ni_{0.954}Zn_{0.030}Co_{0.016}Fe_{1.82}O_4$ | 10.0 | 900 | 4.97 | 5.03 | 1 |
| 14 | $Ni_{0.954}Zn_{0.030}Co_{0.016}Fe_{1.82}O_4$ | 10.0 | 950 | 5.30 | 6.7 | 0.9 |
| 15 | $Ni_{0.954}Zn_{0.030}Co_{0.016}Fe_{1.82}O_4$ | 10.0 | 1000 | 5.33 | 7.9 | 0.8 |

EXAMPLE 2

A nickel-ferrite is produced as described above in Example 1. A eutectic BiMoO phase which corresponds to a $MoO_3$—$Bi_2O_3$ mixture with approximately 16 mol % $Bi_2O_3$ is added as the additive B 1 for reducing the sintering temperature. It has a melting temperature of 620° C.

EXAMPLE 3

In the case of a nickel-ferrite produced according to Example 1, a eutectic Bi—Mo—W—O phase which corresponds to a $Bi_2(MoO_4)_3$—$Bi_2(WO_4)_3$ mixture with approximately 20 mol % $Bi_2(WO_4)_3$, is added as the additive B2 for reducing the sintering temperature. It has a melting temperature of approximately 675° C.

EXAMPLE 4

In the case of a nickel-ferrite produced according to Example 1, a eutectic Bi—Zn—O phase which corresponds to a $Bi_2O_3$—ZnO mixture with approximately 7 mol % Zn, is added as the additive B3 for reducing the sintering temperature. It has a melting temperature of approximately 750° C.

EXAMPLE 5

In the case of a nickel-ferrite produced according to Example 1, a eutectic Bi—Si—O phase which corresponds to a $Bi_2O_3$—$SiO_2$ mixture with approximately 30 mol % $SiO_2$, is added as the additive B4 for reducing the sintering temperature. It has a melting temperature of approximately 870° C.

EXAMPLE 6

In the case of a nickel-ferrite produced according to Example 1, a eutectic Bi—B—O phase which corresponds to a $Bi_2O_3$—$B_2O_3$ mixture with approximately 55 mol % $Bi_2O_3$, is added as the additive B5 for reducing the sintering temperature. It has a melting temperature of approximately 650° C.

EXAMPLE 7

In the case of a nickel-ferrite produced according to Example 1, $Bi_2O_3$ was added as the additive for reducing the sintering temperature.

The results are summarized in Table 2 below.

Film 12, with a second compression temperature that lies way above the first compression temperature of 800° C. does not undergo any thermal change and therefore has a retarding effect on shrinkage forces in films 10 and 14 in the x and y directions, indicated by arrows A and B. The shrinkage in the z direction is not affected by film 12. At approximately 900° C., films 10 and 14 are completely compressed and cannot shrink any further. If the temperature is now further increased to the second compression temperature, the compression process of film 12 commences, whereby the associated shrinkage in the x and y directions, indicated by arrow C, is in turn retarded by films 10 and 14. In the case of thermally stable materials, a fired material is produced in which layers with low and high dielectric constants alternate.

This material has thereby been obtained in one single process step with suitable temperature control.

EXAMPLE 8

A ferrite material with a composition $(Ni_{0.954}Zn_{0.030}Zo_{0.16})Fe_{1.82}O_4$ was produced in that the starting materials were mixed, pre-sintered and milled. 10% by weight $Bi_2O_3$ was added as the additive for reducing the sintering temperature. From this material, a slip was prepared and subsequently molded to form films. Sintering then took place at between 900 and 1100° C. The material showed a dielectric constant $\epsilon \approx 12$ and an initial magnetic permeability $\mu \approx 10$ with a relative density of 98% and good microwave properties.

A film made from this material was laminated between two films made of material with a high dielectric constant, such as a substituted barium-neodymium-titanium-perovskite. These materials were then sintered jointly in air at 970° C. to 1030° C. The microstructure image in part-illustration (a) of FIG. 2 shows by way of example the texture produced

TABLE 2

| Experiment | Composition | Added Phase (% by weight) | Sintering temperature (C.) | Density (g/cm$^3$) | Magnetic Permeability (at 25° C.) | Resonant frequency (GHz) |
|---|---|---|---|---|---|---|
| 16 | $Ni_{0.954}Zn_{0.030}Co_{0.016}Fe_{1.82}O_4$ | B1-3 | 1050 | 4.08 | 7.0 | 0.7 |
| 17 | $Ni_{0.954}Zn_{0.030}Co_{0.016}Fe_{1.82}O_4$ | B2-3 | 1050 | 4.75 | 10.4 | 0.55 |
| 18 | $Ni_{0.954}Zn_{0.030}Co_{0.016}Fe_{1.82}O_4$ | $Bi_2O_3$-3 | 900 | 4.19 | 4.5 | >1 |
| 19 | $Ni_{0.954}Zn_{0.030}Co_{0.016}Fe_{1.82}O_4$ | $Bi_2O_3$-3 | 950 | 4.78 | 7.4 | 0.9 |
| 20 | $Ni_{0.954}Zn_{0.030}Co_{0.016}Fe_{1.82}O_4$ | $Bi_2O_3$-3 | 1000 | 5.10 | 10.1 | 0.65 |
| 21 | $Ni_{0.954}Zn_{0.030}Co_{0.016}Fe_{1.82}O_4$ | B3-3 | 950 | 4.50 | 6.7 | 0.95 |
| 22 | $Ni_{0.954}Zn_{0.030}Co_{0.016}Fe_{1.82}O_4$ | B3-3 | 1000 | 4.87 | 9.3 | 0.7 |
| 23 | $Ni_{0.954}Zn_{0.030}Co_{0.016}Fe_{1.82}O_4$ | B4-3 | 1000 | 4.43 | 7.2 | 0.7 |
| 24 | $Ni_{0.954}Zn_{0.030}Co_{0.016}Fe_{1.82}O_4$ | B4-3 | 1050 | 4.97 | 13.6 | 0.6 |
| 25 | $Ni_{0.954}Zn_{0.030}Co_{0.016}Fe_{1.82}O_4$ | B5-3 | 925 | 4.26 | 4.8 | >1 |
| 26 | $Ni_{0.954}Zn_{0.030}Co_{0.016}Fe_{1.82}O_4$ | B5-3 | 950 | 4.63 | 6.1 | 1 |
| 27 | $Ni_{0.954}Zn_{0.030}Co_{0.016}Fe_{1.82}O_4$ | B5-3 | 1000 | 5.02 | 9.0 | 0.750 |

In all the Examples, the bismuth-containing phase added in each case was added in a proportion of 3% by weight. The sintering temperature of the magnetodielectric material is below 1200° C. in each case.

Materials of this kind are used in a method analogous to WO 00/04577.

FIG. 1 shows a microelectronic substrate comprising three layers, in which a film 12 made of material with a high dielectric constant, also designated a NP0 layer, is arranged between an LTCC film 10 and an LTCC film 14. At temperatures above 800° C., the first compression temperature in this example, the LTCC films 10 and 14 start to compress.

at a sintering temperature of 970° C. to 1030° C., and the part-illustration (b) of FIG. 2 shows the texture at a sintering temperature of 1030° C. In particular, it can be seen from part-illustration (e) that the ferrite material is completely compressed. FIG. 3 shows a film stack, in which a film 12 made of ferrite material is laminated between two films 16, 18 made of material with a high dielectric constant. The outer films 10, 14 are commercially available films (Dupont AT 951). A film stack of this kind can be sintered at 970° C. to 1030° C.

The invention can be used to produce composite substrates which enable the integration of diverse capacitive and inductive components and non-reciprocal elements, and offer the basis for a further miniaturization with improved power.

The invention claimed is:
1. A method of producing a multilayer microelectronic substrate, in which:
   a) a number of thermally combinable films with a first compression temperature are provided;
   b) at least one film with a second compression temperature, which lies above the first compression temperature, is provided;
   c) at least one of the films with the second compression temperature is arranged between films with the first compression temperature;
   d) the laminated films are heated to the first compression temperature, and further heated to a first end-temperature until the films with the first compression temperature are completely compressed, the first end-temperature being kept below the second compression temperature; and
   e) the laminated films are heated to the second compression temperature and, if applicable, further to a second end-temperature in order to compress the at least one film with the second compression temperature,
characterized in that at least one of the films is made from magnetodielectric material, with nickel oxide NiO and ferrous oxide $Fe_2O_3$ as the main components of a ferrite which contains bismuth oxide $Bi_2O_3$ or a eutectic mixture of lead oxide PbO and at least one further metallic oxide or of bismuth oxide $Bi_2O_3$ and at least one further metallic oxide.

2. A method as claimed in claim 1, characterized in that the further metallic oxide is molybdenic oxide $MoO_3$, zinc oxide ZnO, silicon dioxide $SiO_2$, boric oxide $B_2O_3$ or tungsten oxide $WO_3$.

3. A method as claimed in claim 1, characterized in that the bismuth oxide or the eutectic mixture is contained in a quantity of 1 to 10% by weight of the ferrite.

4. A method as claimed in claim 1, characterized in that the ferrite is of the composition $Ni_vZn_wCo_yFe_zO_4$, where $0.88 \leq v \leq 1$, $0 \leq w \leq 0.8$, $0 \leq y \leq 0.03$ and $1.7 \leq z \leq 2.12$.

5. A method as claimed in clam 1, characterized in that at least one further of the films is a film with a dielectric ceramic composition.

6. A method as claimed in claim 5, characterized in that at least the films with the first compression temperature are ceramic strip films.

7. A method as claimed in claim 5, characterized in that the second compression temperature is not more than 100° C. higher than the first compression temperature.

8. A microelectronic substrate as claimed in claim 7, characterized in that the dielectric ceramic composition has a dielectric constant $\epsilon \geq 70$.

* * * * *